United States Patent [19]

Franaszek et al.

[11] 3,916,314

[45] Oct. 28, 1975

[54] NON-LINEAR FILTER FOR DELTA MODULATOR OUTPUT USING SHIFT REGISTER AND TABLE LOOKUP

[75] Inventors: Peter A. Franaszek, Mountain View, Calif.; David D. Grossman, Yorktown Heights, N.Y.; Peter M. Will, Norwalk, Conn.

[73] Assignee: International Business Machines Corporation, Armonk, N.Y.

[22] Filed: Apr. 8, 1974

[21] Appl. No.: 458,936

[52] U.S. Cl. ................ 325/38 B; 325/323; 329/104

[51] Int. Cl.² ........................................ H03K 13/22

[58] Field of Search ........ 325/38 B, 38 R, 321–326; 178/88; 328/119, 128, 171; 332/11 D; 307/293, 229, 260, 263; 329/104, 105, 109

[56] References Cited

UNITED STATES PATENTS

| | | | |
|---|---|---|---|
| 3,393,364 | 7/1968 | Fine | 325/38 B |
| 3,628,148 | 12/1971 | Brolin | 325/38 B |
| 3,643,180 | 2/1972 | Shimamaura et al. | 325/38 B |
| 3,763,433 | 10/1973 | Nicholas | 332/11 D |

*Primary Examiner*—Benedict V. Safourek
*Assistant Examiner*—Robert Hearn
*Attorney, Agent, or Firm*—Sughrue, Rothwell, Mion, Zinn & Macpeak

[57] ABSTRACT

The disclosed delta modulation decoding apparatus responds rapidly to sudden transitions of the delta-modulated signal but avoids excessive noise during periods of no transition. The decoder involves the use of a shift register which receives the incoming delta-modulated code bits and supplies data in parallel to two circuit branches, one containing a delta modulation decoder of any chosen type and the other circuit branch containing a state-responsive, non-linear filter or table, the respective outputs of these two branches being additively combined to provide the decoded and filtered output signal.

8 Claims, 8 Drawing Figures

NON-LINEAR FILTER FOR DELTA MODULATOR OUTPUT USING SHIFT REGISTER AND TABLE LOOKUP

BACKGROUND OF THE INVENTION

1. Field of the Invention

The present invention generally relates to data compaction techniques which involve the differential encoding of analog information, an example of such a technique being delta modulation wherein each element of a sampled analog signal is represented by a 1 or 0 bit that distinguishes between two alternative incremental values. More specifically, this invention is particularly concerned with a modified form of delta modulation decoding.

2. Description of the Prior Art

Delta modulation encoding schemes, as they customarily are designed, experience difficulty in following certain variations of the input signal amplitude. Whenever an abrupt transition from one amplitude to a much different amplitude occurs, it will take a certain length of time for the differential encoding process to build up a corresponding change in the encoded representation of the signal. This condition is known technically as "slope overload," and it arises from the fact that in the conventional delta modulator there are certain practical limitations upon the size of the increments by which the amplitude of the reconstructed wave form may be changed from each signal element to the next. If this increment is made small, the modulator will respond slowly to steep transitions in the amplitude of the input signal wave form, thereby introducing phase shifts and other distortions into the reconstructed signal wave form. On the other hand, if the increment is made large enough so that the encoding process will immediately start to follow a very steep and prolonged transition of the input signal amplitude, then with the same large increment, the system will become unstable and show a tendency to overshoot and oscillate when the transition peak is reached, and it will generate an undesirable amount of granular noise during intervals when the input signal amplitude is constant or only slightly varying.

Some delta modulators provide a differential encoding increment of adjustable size which is small at times when the system is idling and larger at times when the signal amplitude is varying rapidly. The kind of response which is obtained from these devices is determined entirely by the cumulative action that occurs in the integrative feedback loop of the modulator, wherein a decoded signal is reconstructed by many successive additions and subtractions of the various incremental values for comparison with the input signal. If the system mistakenly commits itself to a large increment size at a time when the hitherto steep transition is about to level off or reverse, then some readjustment time will be needed by the system to undo the effect of this error by the successive accumulation of additional corrective increments, some of which in turn may cause an over-correcting action that still further prolongs its cumulative readjustment process.

The patent to Shimamaura et al., U.S. Pat. No. 3,643,180, is exemplary of a delta modulation encoder in which the decoder portion of the network is a double integrator. The two integrator circuits are interconnected by a nonlinear impedance network which exhibits one value of impedance when the magnitude of the voltage applied thereto is below a predetermined value and another value of impedance when the magnitude of the voltage applied thereto exceeds the predetermined value.

Some delta modulation encoders have included lookahead features. For example, the patent to Brolin, U.S. Pat. No. 3,628,148, illustrates in FIG. 1 a "bogus" signal generator that precedes a delta modulation encoder and which is capable of looking ahead at the input analog signal and modifying it when necessary in order to prepare the encoder for any upcoming steep signal transitions. Brolin's bogus signal generator operates only on the analog signal, not the delta-modulated signal, and it precedes and is in series with the encoder. Hence, it cannot apply modifications to the encoded output signal at different levels thereof. Although Brolin provides a lookahead feature in his transmitting encoder, the receiving decoder shown in FIG. 6 has no lookahead feature capable of scanning delta-modulated code bits that have not yet entered the decoder in order to anticipate and compensate for abrupt trends in the delta-modulated signal. The reason why this decoder has no lookahead feature is that its structure is identical with that of the feedback loop in the encoder (which performs a comparable decoding function), and it would be impossible to have in the encoder any device capable of determining what the currently encoded bit should be, based upon what any future encoded bits will be.

The patent to Fine, U.S. Pat. No. 3,393,364, shows a delta modulation decoder in FIG. 7. This decoder includes an input shift register and a level selecting store of the table lookup type. This may be compared with FIG. 1 of the Fine patent which shows a typical prior art decoder consisting of an integrator. Fine can provide only a limited number of absolute signal values for a given shift register capacity, and he is not able to modify the output of the delta modulation decoder by looking ahead at bits that have not yet entered the decoder to detect a trend in the encoded signal.

SUMMARY OF THE INVENTION

There is a need at the present time for a delta modulation decoding apparatus which responds rapidly to sudden transitions of a delta-modulated signal but avoids excessive noise during periods of no transitions ("granular noise"). Elimination of granular noise can be accomplished by smoothing the delta modulator decoder output, while reduction of slope overloading can be accomplished by sharpening the delta modulator decoder output. Thus, what is needed is a filter which smooths or sharpens the delta modulator decoder output, depending on whether the output is idling or rapidly changing. Since sharpening is the opposite of smoothing, what is required is a non-linear filter.

The present invention accomplishes all of the foregoing objectives by a unique approach which involves digitally analyzing the patterns of code bits that have been generated by a delta modulator to ascertain the current "state" of the delta-modulated code input signal. Instead of the code entering the delta modulator decoder directly, it is brought into a shift register. From the middle of this shift register (or alternatively from the end of a parallel shift register having fewer stages), the delayed code signal is brought into a delta modulator decoder of any desired type which generates a raw or unfiltered digital output signal by integrating action.

Thus, the shift register delays the entry of each delta-modulated code bit into the integrating decoder until a sufficient number of succeeding code bits have been registered to indicate the future trend of the signal. In addition, the shift register retains a series of code bits which were previously decoded by the integrating decoder. Thus, at any given moment, the bit pattern in the shift register characterizes an uniquely defined filter state. A table lookup on this uniquely defined filter state gives the value of the function of the non-linear filter. The filtered delta modulator decoder output is obtained by digitally adding this non-linear function to the raw delta modulator decoder output. Thus, the invention provides a decoding operation with a very wide range of adjustment so that it can readily follow very steep signal transitions without incurring the usual penalty of excessive granular noise during periods of no transition. Because the non-linear filter, according to the invention, responds to a pattern of bits, some of which belong to the immediate past, one to the present, and the remainder to the future, the filter provides an undelayed anticipatory response which the delta modulation decoder, because of its cumulative integrating action, cannot possibly have.

BRIEF DESCRIPTION OF THE DRAWINGS

Other objects, features and advantages of the invention will be apparent from the following more particular description of a preferred embodiment of the invention, as illustrated in the accompanying drawings.

DESCRIPTION OF THE PREFERRED EMBODIMENT

Figure 1:
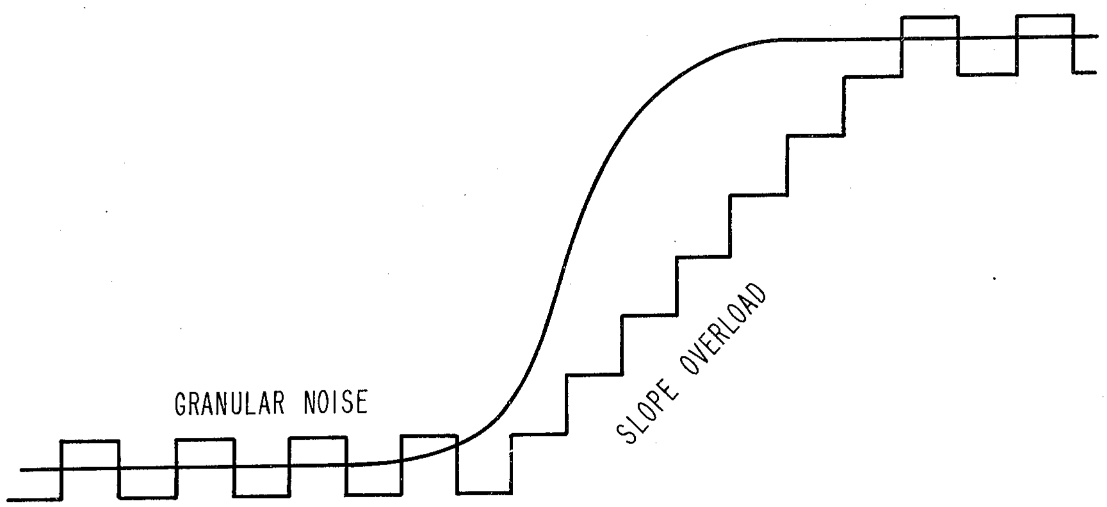
FIG. 1 is a graphical illustration of a desired analog output signal and a typical delta modulation decoded signal which portrays the effects overcome by the invention.

Referring now to the drawings and, more particularly, to FIG. 1, there is illustrated the application of delta modulation to a time varying input signal. When the input is constant, the idling oscillation of the delta modulator output is termed "granular noise." When the output is rapidly increasing or decreasing, the failure of the delta modulator output to conform is termed "slope overload." If the delta modulator step is made large, slope overload improves while granular noise worsens. If, on the other hand, the step is made small, granular noise improves while slope overload worsens.

Elimination of granular noise can be accomplished by smoothing the delta modulator output, and reduction of slope overloading can be accomplished by sharpening the delta modulator output. This the invention accomplishes with a non-linear filter which smooths or sharpens the delta modulator decoder output, depending on whether the output is idling or rapidly changing.

Figure 2:
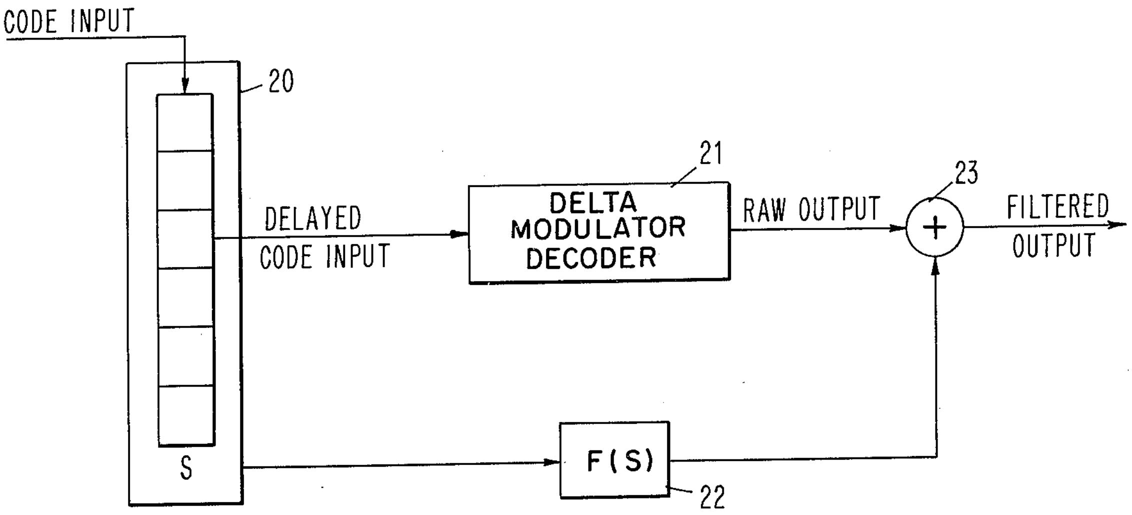
FIG. 2 is a general block diagram of a delta modulation decoder employing the principles of the invention.

The basic principle of the invention is illustrated in the block diagram of FIG. 2. The code entering the delta modulator decoder is brought into a shift register 20. The shift register supplies data in parallel to two circuit branches. The first branch contains a delta modulation decoder 21 of any suitable type which generates a raw, unfiltered output signal by integrating action. The other circuit branch contains a state-responsive, non-linear filter 22 which generates modifying gradations as its output. The respective outputs of these two circuit branches are additively combined in adder 23 to provide the filtered decoder output signal. The expression "raw output" or "raw unfiltered output" is not meant to imply necessarily that this output is an analog signal. The decoder 21 can be of the type which produces a coded digital signal, and it will be assumed herein that this is the case. The filtered output subsequently can be converted to analog form. The shift register 20 serves two purposes. First, it delays the entry of each delta-modulated code bit into the integrating decoder 21 until a sufficient number of succeeding code bits have been registered to indicate the future trend of the signal. Second, it presents to the state-responsive, non-linear filter 22 a trend-indicating pattern of code bits, at least some of which are in future time relation to the bit currently being decoded by the integrator. By this means, the filter 22 is able to detect a future trend in the encoded signal and modify the raw output of the integrator 21 accordingly. As a specific example, the shift register 20 has six stages, two of which precede the stage storing the bit that currently is being decoded by the decoder integrator 21, and three of which follow that stage. This provides a six-bit pattern which includes a lookahead at two upcoming bits and lookback at the three most recently decoded bits. The filtering operation is in the nature of a table lookup and, therefore, is not subject to cumulative errors. Yet, since the non-linear filter 22 is effectively in parallel with the decoder integrator 21, the delta modulation decoder, according to the invention, retains the benefits of the cumulative or integrating action of the conventional decoder 21. In effect, the state-responsive filter 22 merely provides shades or gradations of any raw output voltage level that would otherwise have been produced by the integrating decoder 21.

Figure 3:
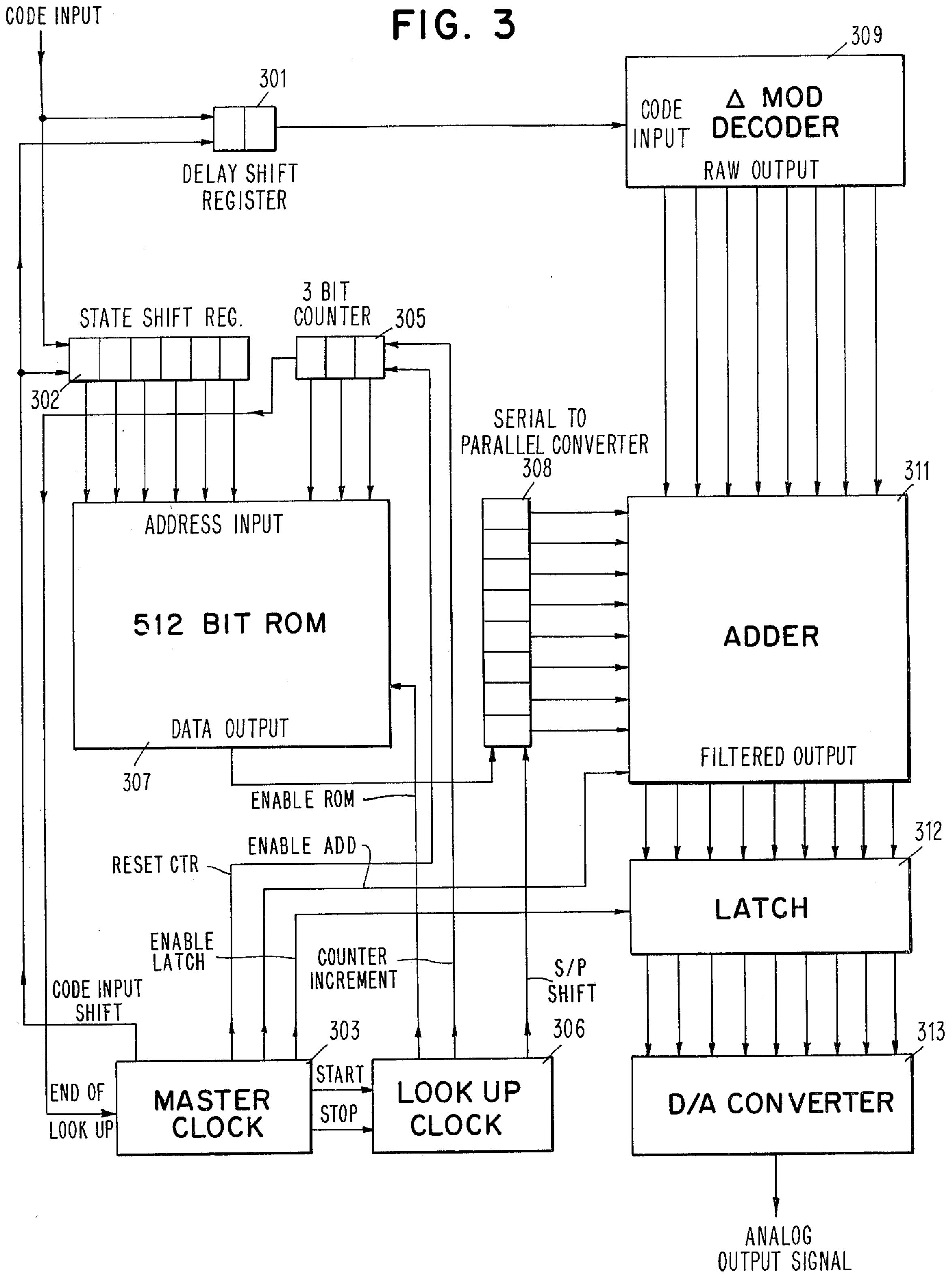
FIG. 3 is a detailed block diagram of a preferred embodiment of the invention.
Figure 4:
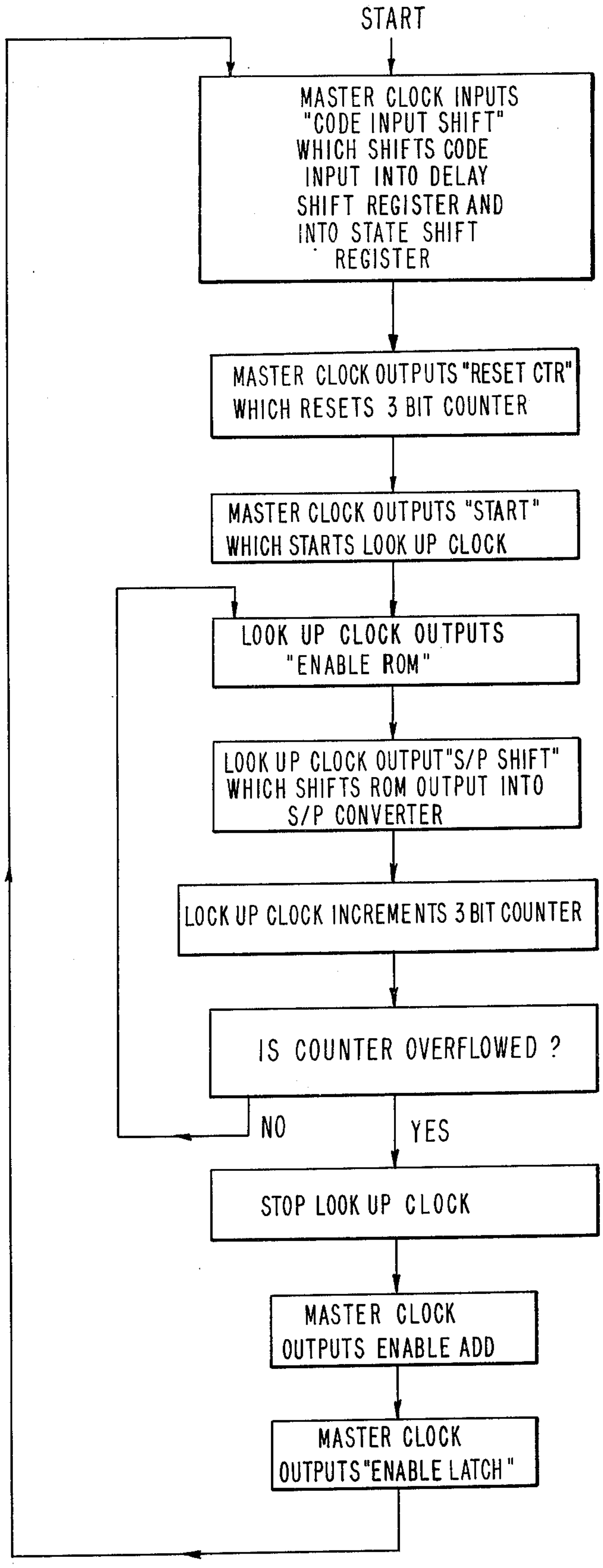
FIG. 4 is a flow diagram illustrating the operation of the embodiment of the invention shown in FIG. 3.

FIG. 3 illustrates a specific implementation of the invention the operation of which can best be understood by concurrent reference to FIG. 4 of the drawings. The delta-modulated code bit input is shifted into the first stage of a two-bit delay shift register 301. Simultaneously, the code bit input is shifted into the first stage of a six-bit "state" shift register 302. This state is referred to as S. In both cases, this is done under the control of a master clock 303. Concurrently with the shifting of a code bit into the shift registers 301 and 302, the master clock 303 resets a three-bit binary counter 305 and starts a lookup clock 306. The lookup clock has a frequency at least eight times that of the master clock which is synchronized with the delta modulation code input. The outputs of the state shift register 302 and the three-bit counter 305 constitute the address input to a 512 bit read-only memory 307. The output of the read-only memory 307 is a single bit output, i.e., a 1 or a 0, corresponding to the particular address input to the memory. This single bit output is shifted into a serial to parallel converter 308. The serial to parallel converter 308 is simply a shift register controlled by the secondary clock 306. After the single bit output from the read-only memory 307 has been shifted into the serial to parallel converter 308, the three-bit counter 305 is incremented by the lookup clock 306. This results in a new address input to the read-only memory 307, and the next single bit output therefrom is shifted into the serial to parallel converter 308. This process continues until the serial to parallel converter is loaded to capacity at which time there will be an overflow from the three-bit counter 305. This overflow is detected by the master clock 303 which then stops the lookup clock 306. At this time the serial-to-parallel converter 308 contains the digital filter value obtained by looking up the state in the filter table contained in the read only memory 307.

Meanwhile, the code input delayed two bits by the delay shift register 301 is decoded by the delta modulator decoder 309. Decoder 309 is a conventional integrating delta modulator decoder providing an eight-bit raw or unfiltered output, which in this embodiment is assumed to be in coded digital form. The raw eight-bit output from the decoder 309 is provided as one input to an eight bit parallel binary digital adder 311. The other input to adder 311 is the output of the serial to parallel converter 308. When the lookup clock 306 is stopped, the adder 311 is enabled by the master clock 303 thereby providing a summed or filtered output to the latch 312. The latch 312 is enabled to temporarily store the output of adder 311. A digital to analog converter 313 receives as its input the output of latch 312 and provides a filtered analog signal. The process then continues as indicated in FIG. 4 for the next code bit input.

Figure 5:
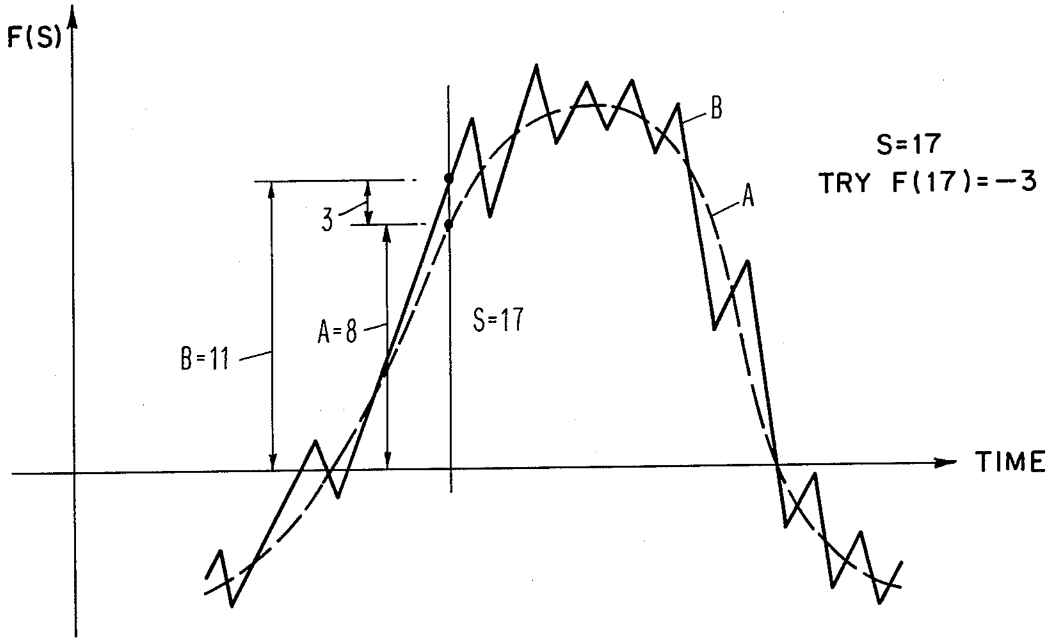
FIG. 5 is a wave form representation of a desired analog output signal having superposed thereover the analog output obtained by the digital-to-analog conversion of a typical delta modulator decoder integrator output prior the establishment of the transfer function of a non-linear filter.
Figure 6:
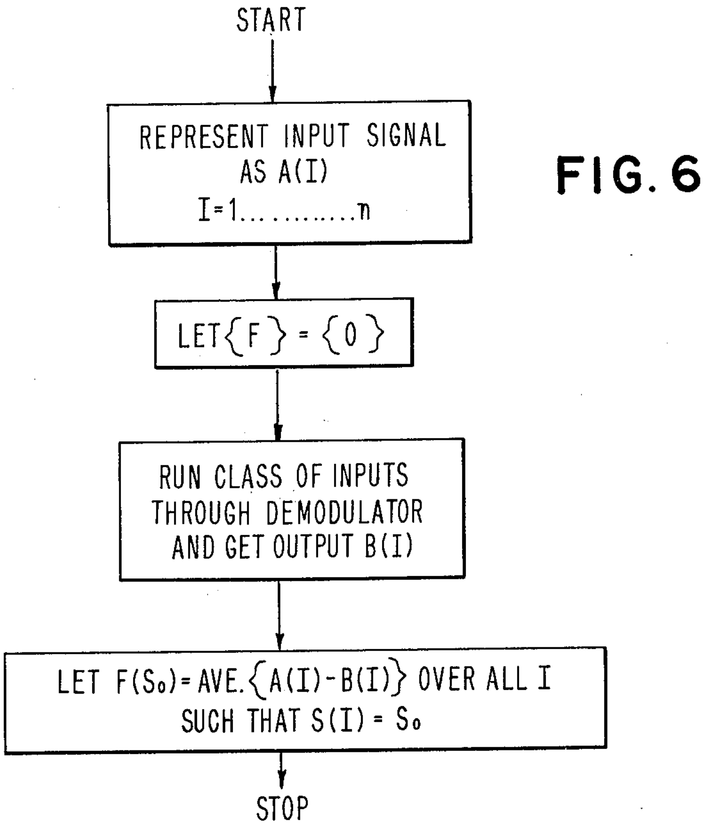
FIG. 6 is a flow diagram illustrating the empirical process by which the transfer function of the non-linear filter is established.

The actual functions F(S) stored in the read-only memory 307 are determined empirically. The mathematical formulation of F(S) depends upon the particular delta modulation scheme being used. The process of determining the F(S) values is illustrated in FIGS. 5 and 6 of the drawings. In FIG. 5, the dotted line represents a portion of a relatively low frequency sine wave which is assumed to be the desired output for purposes of the present description. It will be understood, however, that the choice of a wave form input to the delta modulator used for generating the code upon which the delta modulator decoder according to the invention operates is not limited to sine waves. In fact, various wave forms, both periodic and aperiodic including actual speech wave forms may be used, depending on the intended application of the delta modulator decoder. The solid line in FIG. 5 represents the raw or unfiltered output from the delta modulator decoder. The process of choosing the functions F(S) to cause convergence of the two-wave forms shown in FIG. 5 is illustrated by the flow diagram of FIG. 6. First, it is important to choose a representative input signal which, again for purposes of this description, is assumed to be a sine wave. Initially, the read-only memory 307 contains no data representing the functions F(S), i.e., the output of the memory is 0. The chosen class of inputs, e.g., sine waves of varying frequencies, are passed through the delta modulator decoder to obtain a series of outputs. These outputs are then compared with the desired outputs to determine the function F(S).

In performing this operation, the initial precedure is crucial, that is, choosing a representative input signal as A(I) where $I=1 \ldots n$. The choice should match the application in which the delta modulator decoder is to be used. This representative input is run through the demodulator to obtain output B(I). The output is compared with the desired output to determine F(S). It is important to realize that a correction at one frequency may be opposed to corrections required at different frequencies. As a result, trade-offs are required before the values of the non-linear filter function F(S) can be fixed. Generally, the values of F(S) are determined by letting $F(S_o)$ equal the average difference between A(I) and B(I) over all I such that S(I) equals $S_o$. This is done for each $S_o$.

Take, for example, the situation illustrated in FIG. 5. At the time when $S=17$, according to the illustration, B is three units greater than the desired point on the dotted curve A; therefore, we may want to try $F(17) = -3$, and run the representative input through the demodulator again. However, we must consider all points at which $S=17$ before fixing the value of F(17).

In a test of the delta modulator decoder according to the invention, sine waves and square waves having a variety of amplitudes and periods were used. In each case, the delta modulator decoder output after filtering was compared to the unfiltered output, and in no case was the unfiltered output better than the filtered output. In fact, in most cases the filtered output was substantially better than the unfiltered output. On sine waves, the filter reduced RMS noise by 30 percent, averaged over the periods and amplitudes tried. On square waves, the delta modulator decoder reduced the RMS noise by 50 percent. As mentioned hereinabove, the values F(S) depend upon the particular delta modulator being used. In this test, a delta modulator of the type shown in Brolin, U.S. Pat. No. 3,628,148, was used.

Figure 7:
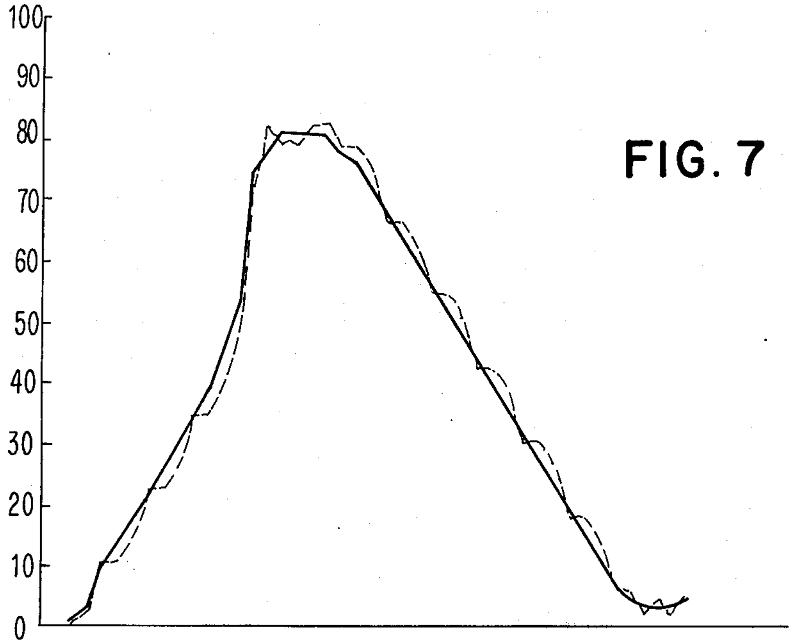
FIGS. 7 and 8 are typical wave forms illustrating the analog output obtained by the digital-to-analog conversion of the filtered digital output of a delta modulator decoder according to the invention.
Figure 8:
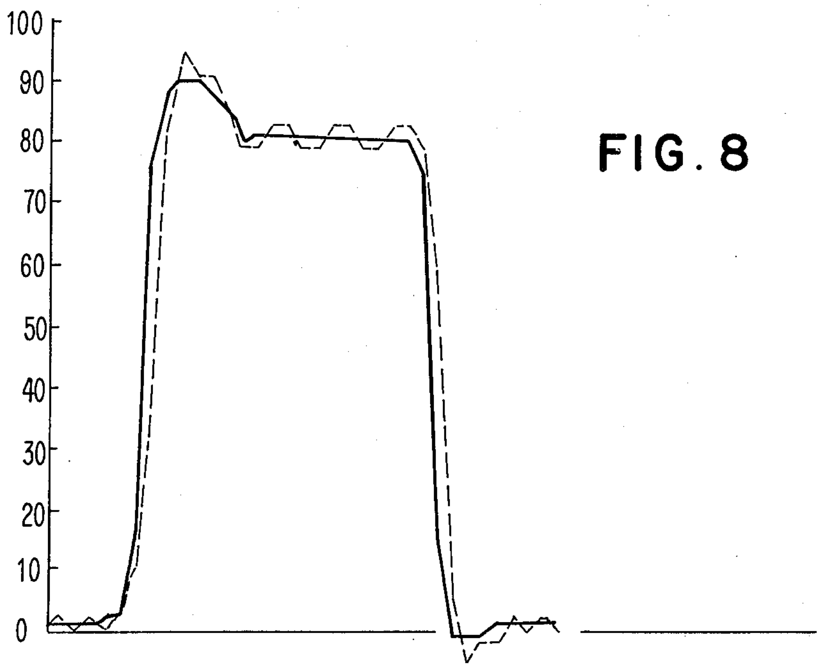

Examples of the performance obtained in the test are shown in FIGS. 7 and 8 of the drawings. In FIG. 7, the analog input signal is a sine wave of 80 units peak to peak and a wave length of 40 samples. The dotted line shows the analog output obtained by the digital-to-analog conversion of the digital unfiltered output, and the solid line shows the analog output obtained by the digital-to-analog conversion of the digital filtered output. While neither curve looks exactly like the input signal, the filtered wave is noticeably better in several ways. It is smoother on the rising and falling portions of the curve. It is also smoother on the peak portions of the curve and has less overshoot at the peak.

A second example of the performance obtained in the test is shown in the graph in FIG. 8. In this case, the analog input signal is a square wave having an amplitude of 80 units peak to peak and a wave length of 40 samples. Again, the dotted lines show the analog unfiltered output, and the solid line shows the digital filtered output. The filtered curve is noticeably better in that it is smoother on the flat portions of the input signal. In addition, it has less overshoot at the peak and has a faster rise and fall. Quantitatively, in this example, the largest step in the filtered output is 60 units at the edge of the square wave, while the largest step in the unfiltered output is only 48 units. If one considers the error obtained by subtracting the output signal from the input signal, one sees that for the unfiltered output, the worst point has an error of 34 units, while for the filtered output, the worst point has an error of 16 units.

It will be apparent that the embodiment shown is only examplary in that various modifications can be made in construction and arrangement within the scope of the invention as defined in the appended claims.

We claim:

1. An improved delta modulator decoder employing non-linear filtering for the elimination of granular noise and the reduction of slope overloading, comprising:

a. input shift register means for receiving a delta-modulated code input, b. a delta modulator decoder connected to said input shift register means and receiving a delayed delta-modulated code input therefrom and providing an integrated, unfiltered digital output, c. non-linear filter means connected to said input shift register means and responsive to the bit pattern thereof for generating an output corresponding to a filter function determined by said bit pattern, and d. adding means connected to receive as two inputs said unfiltered output from said delta modulator decoder and the output generated by said non-linear filter means for adding said two inputs to produce a filtered output.

2. A delta modulator decoder as recited in claim 1 wherein said input shift register means has a plurality of stages and said delayed delta-modulated code input corresponds to the state of at least the third stage thereof to provide a lookahead of at least two upcoming bits in said code and the remaining stages beyond said at least third stage provide a lookback of the most recently decoded bits thereby establishing a trend-indicating pattern of code bits in said input shift register means.

3. A delta modulator decoder as recited in claim 2 wherein said non-linear filter means includes an addressable memory having stored therein a plurality of filter function values, said trend-indicating pattern of code bits constituting, at least in part, an address input to said memory.

4. A delta modulator decoder as recited in claim 3 wherein the outputs of said delta modulator decoder and said addressable memory are parallel binary words and said adding means is a parallel binary adder providing a parallel binary word output as said filtered output.

5. A delta modulator decoder as recited in claim 4 further comprising digital-to-analog converter means connected to receive said parallel binary word output from said parallel binary adder for generating an analog, filtered output signal.

6. A delta modulator decoder as recited in claim 3 wherein said input shift register means comprises a first shift register having at least two stages connected to the input of said delta modulator decoder and a second shift register having a plurality of at least five or more stages connected to the address input of said memory.

7. A delta modulator decoder as recited in claim 6 further comprising a counter having a cycling period less than or equal to the period of said input delta modulated code, the output of said counter together with the output of said second shift register constituting the address input to said memory.

8. A delta modulator decoding method permitting the non-linear filtering of a decoded delta modulation code for the elimination of granular noise and the reduction of slope overloading comprising the steps of:

a. temporarily storing a sequential series of delta-modulated code bits, b. decoding an intermediate code bit in said series as an integral function of code bits which precede and include said intermediate code bit, thereby generating an unfiltered output, c. electronically looking up in a storage device storing predetermined values, a filtering function corresponding to the bit pattern of said temporarily stored series as a whole, and d. adding said filtering function to said unfiltered output to produce a filtered output.

* * * * *